United States Patent [19]

Clark et al.

[11] Patent Number: 5,245,412
[45] Date of Patent: Sep. 14, 1993

[54] LOW CAPACITANCE SILICON TRANSIENT SUPPRESSOR WITH MONOLITHIC STRUCTURE

[75] Inventors: Oscar M. Clark, Tempe; Timothy M. Dalsing, Chandler, both of Ariz.

[73] Assignee: Square D Company, Palatine, Ill.

[21] Appl. No.: 836,491

[22] Filed: Feb. 18, 1992

[51] Int. Cl.$^5$ .................... H01L 23/32; H01L 29/90; H01L 27/02; H01L 23/16

[52] U.S. Cl. .................................. 257/601; 257/603; 257/723

[58] Field of Search .......... 357/76, 13, 51, 75, 357/67

*Primary Examiner*—Mark V. Prenty
*Attorney, Agent, or Firm*—Michael J. Femal; Richard J. Graefe

[57] ABSTRACT

A semiconductor device for suppressing transient voltages is adapted for use on high frequency data lines. The semiconductor device combines an avalanche type diode which has high capacitance in series with a rectifying diode which has a capacitance three magnitudes lower. The resultant semiconductor device is fabricated using a single, monolithic silicon die instead of stacking two separate dies as has been done in prior art transient voltage suppressors to achieve the same characteristics. The semiconductor die is adaptable for packaging in surface mountable DIP packages and other common circuit board mountable packages.

13 Claims, 2 Drawing Sheets

LOW CAPACITANCE SILICON TRANSIENT SUPPRESSOR WITH MONOLITHIC STRUCTURE

DESCRIPTION

1. Technical Field

Applicants' invention relates generally to electromagnetic pulse suppressor devices, and more particularly to a low capacitance, low voltage transient voltage protector diode semiconductor chip for use in an encapsulated package for mounting on a printed circuit board assembly. This type of low capacitance diode is required to prevent signal attenuation of high frequency or high data rate signals common to communication networks and computer systems.

2. Background Art

It is well known that high voltage power surges or transients can cause fatal destruction of sensitive electronic devices such as computers, communication equipment, and consumer goods that employ integrated circuits and other semiconductor devices. These transients can be generated by lightning, inductive switching, or electrostatic discharge (ESD). Computer mainframes and data terminals are highly susceptible to transient voltages coupled on or injected into their communication lines. The human body can act as an capacitor and store accumulated electrostatic charges that can reach in the tens of thousands of volts just by a person walking on a carpeted floor. This stored charge will be dissipated into the equipment when a person touches it, if it is at a different voltage potential. These types of transient voltages are characterized by very fast rise times and high peak voltages. The vulnerability for destruction of the semiconductors employed in these devices is directly related to these rise times and peak voltages. The steeper the wavefront, the more likelihood for failure for a given type of semiconductor. The total energy within any transient is not always the destructive force of a semiconductor. The energy capability or withstand surge capability of the semiconductor is inversely related to the rate of rise of the transient pulse, i.e., the threshold of failure is lower for faster rise times. The magnitude of the voltage transient may also cause a breakdown of the intrinsic region of the semiconductor, its electrical insulation, or its passivation layer.

MOS integrated circuits very often have a clamp diode or some type of input network integrated within the IC substrate. High noise immunity circuits are still subject to damage by voltage transients as a result of the power dissipation in the substrate diodes. Excess current through the input diode can cause opens or shorts of the very circuit that it is supposed to protect. A preferable method would be to utilize some type of external transient protection means that can absorb this extra power. These means include adding zener diodes, MOV's, gas surge arrestors, capacitors, or a special type of silicon diode called an avalanche junction transient voltage suppressor (AJTVS) diode to shunt the transient signal to ground.

Zener diodes are effective at suppressing transients, but as the magnitude of the transient increases, so to does the magnitude of the clamping voltage. Gas surge arrestors fire at higher voltages to fire, typically greater than 500 volts, to become effective and are larger in size than may be allowable on a particular application. MOV devices degrade over continued usage and the clamping voltage increases as the transient voltage increases. Capacitors can shunt high frequency transients but are not effective in high frequency (RF) applications because of signal distortion. Because of its small size and more importantly, its very fast response time, the AJTVS diode is ideal for use on printed circuit boards where there are many signal lines that are to be protected.

The AJTVS diode is a silicon avalanche device characterized by a large PN junction which is capable of handling high power, short duration transients. However, this larger surface area results in an inherently higher capacitance than other silicon devices. This higher capacitance would cause signal attenuation at higher frequencies, making them unusable for RF applications. Adding a lower capacitance device in series with the AJTVS diode will correct this problem.

One type of AJTVS diode is a silicon junction suppressor manufactured by the present assignee and marked under the trademark TRANSZORB. The LC and LCE series of TRANSZORB diodes include a series rectifier internal to the package that provides an equivalent lower capacitance for the complete device. This package combines the two separate semiconductor chips by stacking one on top of the other and packaging it as an axial leaded device. Although this device is highly effective at suppressing transients, the package itself does not lend itself to high density or low profile circuit board assemblies. Further, because two separate chips are involved, fabrication costs are high.

A preferable solution would be to provide a surface mountable package which could be placed in close proximity to the MOS chip that is to be protected. In the past it has been difficult to package this type of component in surface mountable packages suitable for low profile packages because of size restrictions on the overall height of the two-leaded device. It would also be preferable to have a single chip that combines the functions of the two separate semiconductor chips. The present invention eliminates these and other problems without loss of performance or reliability.

SUMMARY OF THE INVENTION

Accordingly, the principal object of the present invention is to provide a low profile transient surge suppressor semiconductor chip that combines the function of an AJTVS diode and a series silicon rectifier.

It is a further object of the invention to provide a low capacitance transient surge suppressor device for use on high frequency data lines without significant attenuation of the communication signal levels.

In one embodiment of the invention, the semiconductor chip is a single monolithic structure that combines the equivalent of a AJTVS diode directly to the equivalent of a rectifier diode. The resulting semiconductor chip is suitable for use in surface mountable packages.

Other features and advantages of the invention will be apparent from the following specification taken in conjunction with the accompanying drawings in which there is shown a preferred embodiment of the invention. Reference is made to the claims for interpreting the full scope of the invention which is not necessarily represented by such embodiment.

DETAILED DESCRIPTION

Although this invention is susceptible to embodiments of many different forms, a preferred embodiment will be described and illustrated in detail herein. The present disclosure exemplifies the principles of the invention and is not to be considered a limit to the broader aspects of the invention to the particular embodiment as described.

Figure 1:
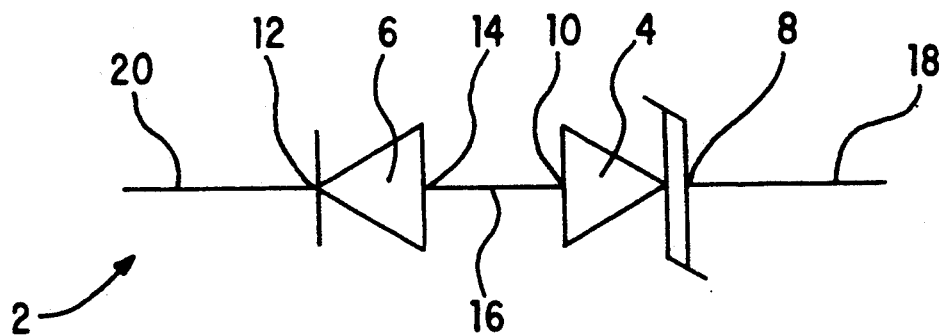
FIG. 1 is a schematic diagram of a low capacitance transient voltage suppressor consisting of an AJTVS diode and a rectifier diode representative of the present invention.

In one embodiment of the invention, a semiconductor device 2 that comprises a low capacitance transient voltage suppressor consists of an avalanche junction transient voltage suppressor (AJTVS) diode 4 and a rectifier diode 6 connected in series as represented by the schematic diagram of FIG. 1. The AJTVS diode 4 has a cathode 8 and an anode 10. The rectifier diode 6 has a cathode 12 and an anode 14. Anode 10 and anode 14 are connected at junction 16. Cathode 8 has an external connection 18.

This arrangement is equivalent to two capacitors connected in series. Basic electronic theory shows that the resultant capacitance of two capacitors connected in series is equal to the product of the two capacitances divided by the sum of the two capacitances. This results in the total capacitance always being less than the lower of the capacitors. Because the AJTVS diode 4 has a large area junction, it has a relatively high capacitance, especially for low voltage types. At the stand-off or operating voltage, the capacitance of a 6.8 volt AJTVS diode 4 will be greater than 10,000 pf. The rectifier diode 6 will have a much lower capacitance in the 10–100 pf range. These series combination of the two will result in an equivalent capacitance that is three order of magnitude lower than if the AJTVS diode 4 were used alone.

Figure 2:
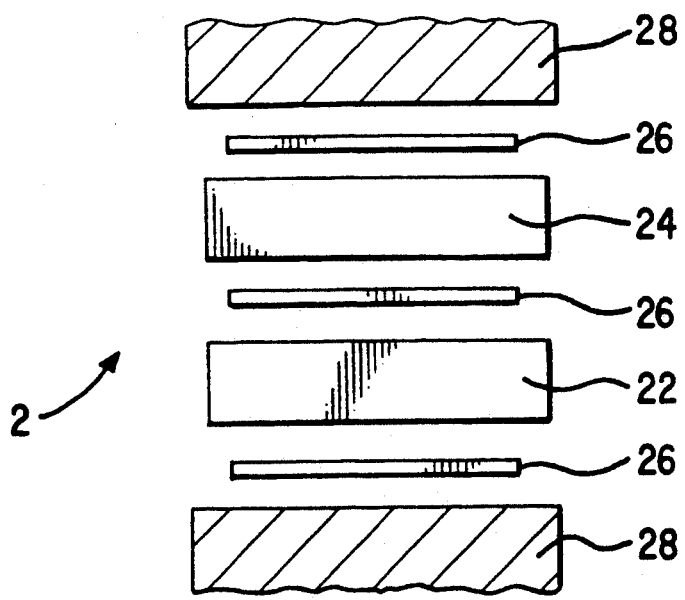
FIG. 2 is a side view of a low capacitance transient voltage suppressor consisting of an AJTVS diode and a rectifier diode constructed according to the prior art.

Referring now to FIG. 2 of the drawings, a semiconductor device 2 that comprises a low capacitance transient voltage suppressor is illustrated that is representative of construction of prior art devices. A first semiconductor chip 22 having a PN junction and metallized surface areas for making electrical connections is a low voltage, silicon AJTVS diode 4 as referenced by FIG. 1. A second semiconductor chip 24 also having a PN junction and metallized surface areas for making electrical connections is a silicon rectifier diode 6 as referenced by FIG. 1. The first semiconductor chip 22 is electrically bonded to the second semiconductor chip 24 by utilizing bonding techniques that are very well known in the semiconductor industry. In this instance, a solder chip 26 is the bonding medium. External terminals 28 are electrically bonded in a similar fashion to the opposite ends of the stacked semiconductor chips 24, 26 to complete the assembly. The completed assembly is then packaged by encapsulation or other packaging techniques. The additional height resulting from stacking the two chips 22, 24 precludes packaging in dual in-line packages, or in surface mountable packages.

Figure 3:
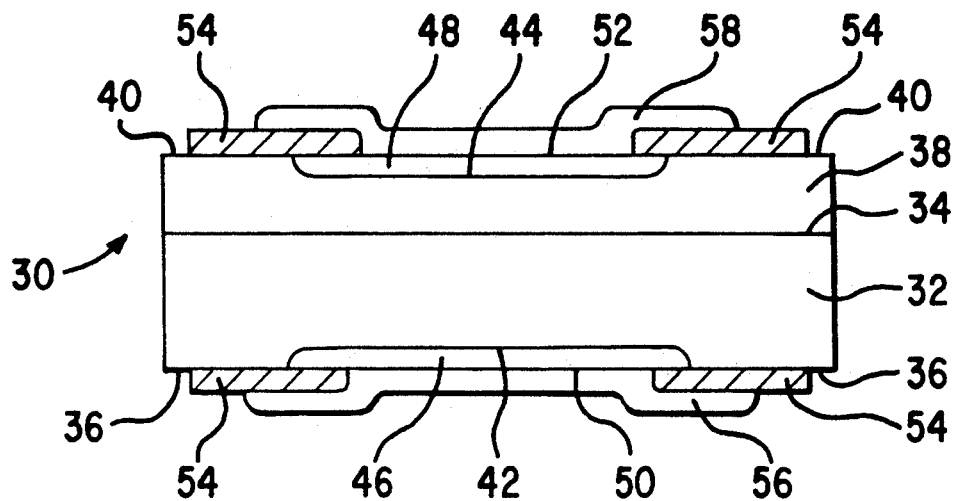
FIG. 3 is a side view of a low capacitance transient voltage suppressor consisting of an AJTVS diode and a rectifier diode constructed according to the preferred embodiment.

In the preferred embodiment of the invention, as disclosed by the cross sectional view of FIG. 3, a low capacitance, transient voltage suppressor 30 having a single, monolithic structure is shown. A crystalline silicon substrate 32 has first and a second sides 34 and 36. The substrate 32 is an n-type that is phosphorous doped to give it low resistivity. An epitaxial layer 38 is deposited on the first side 34 of the substrate 32. This layer 38 is also an n-type that is phosphorous doped to give it high resistivity. An oxidation process results in a layer, 8000 Angstroms thick, of silicon dioxide on both sides 36, 40 of the combined substrate 32 and layer 38. After photolithography, channel stops are formed at the ends of sides 36 and 40 by diffusing phosphorous into the substrate 32 and layer 38. A second oxidation step on sides 36 and 40, is followed by a second photolithography step and a diffusion of boron into the substrate 32 and layer 38. A rectifying PN junction 42 is formed on the substrate 32 and a rectifying PN junction 44 is formed on the layer 38. A third oxidation step on sides 36 and 40, is followed by a third photolithography step to define a region for diffusing boron into the substrate 32 and layer 38. The resultant region 46 and the region 48 become p-types. The surface 50, 52 of the regions 46, 48 serve as a means for electrical connections. Glass passivation along the edges of the surfaces 36, 40, 50, and 52 provides a seal between the substrate 32 and the region 46, and between the layer 36 and the region 48. A metal evaporation process deposits titanium, nickel, and gold to form a metal contact 56 on the surface 50 and a metal contact 58 on the surface 52. Other metals such as chromium may be used in the evaporation process to provide the metal contacts to complete the fabrication of the low capacitance, transient voltage suppressor 30 having a single, monolithic structure.

The low resistivity N-type substrate 32, the rectifying PN junction 42, and the P-type region 46 combine to form an avalanche diode of the type commonly used as transient voltage suppressors and as illustrated in FIG. 1 as the AJTVS diode 4. The cathode 8 is the region 46 and the anode 10 is the substrate 32. The high resistivity N-type layer 36, the rectifying PN junction 44, and the P-type region 48 combine to form a rectifier diode and as illustrated in FIG. 1 as the rectifier diode 6. The cathode 12 is the region 48 and the anode 14 is the layer 36. The metallized surface areas 56, 58 act as the electrodes for attaching the semiconductor die 30 to external leads in the final package.

Figure 4:
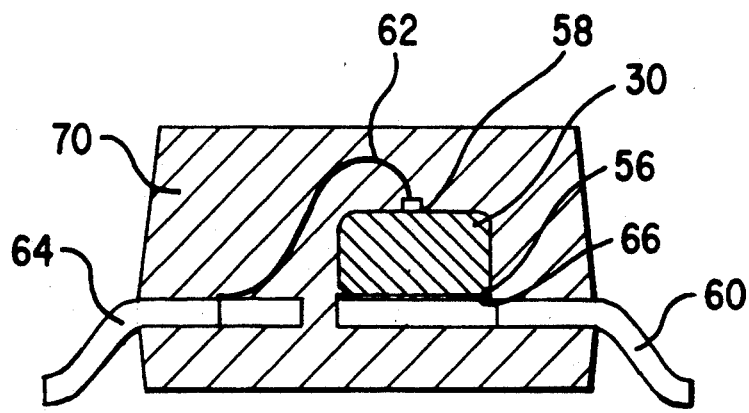
FIG. 4 is a side view of a low capacitance transient voltage suppressor consisting of an AJTVS diode and a rectifier diode housed in a dual-in-line package.

In one embodiment of the invention, as disclosed by the cutaway, cross sectional view of FIG. 4, the low capacitance transient voltage suppressor die 30 is packaged in a DIP package 70. The bottom electrode 56 of FIG. 3, which is on the bottom portion of the die 30, is electrically bonded to the lead 60. The electrode 58, which is on the top portion of the die 30, is electrically bonded to a conductive metal jumper 62, which in turn is electrically bonded to the lead 64, completing the circuit. Various die bonding and soldering techniques are very well known in the manufacturing of semiconductors. For the described embodiment, a gold-germanium solder alloy 66 provides the bonding means. One end of jumper 62 is bonded to the metallized top of semiconductor die 30 by the same technique of solder bonding. The other end jumper 62 is bonded to the lead 64 in similar fashion. The completed device will have a voltage rating up to 15 VDC operational and 30 VDC peak. Peak power dissipation typically could range up to 500 Watts, but higher power ratings are possible and are not considered to be a limitation of the invention.

While the specific embodiments have been illustrated and described, numerous modifications are possible without departing from the scope or spirit of the invention. Although only one device is illustrated, it should be understood that semiconductor dies are fabricated on wafers containing multiple devices. Likewise, the semiconductor die could be packaged as a molded axial or radial leaded device or in a hermetically sealed case.

We claim:

1. A semiconductor device for limiting transient voltages and comprising:
   (a) a semiconductor substrate having first and second major surfaces, said substrate having low resistivity and doped with a first material to give it a first conductivity type;
   (b) a first epitaxial layer upon said first major surface of said substrate and having substantially higher resistivity than and the same conductivity type as said substrate, said first epitaxial layer having a first major surface;
   (c) a first semiconductor region selectively formed in said second major surface of said semiconductor substrate and doped with a second material, said first semiconductor region having the opposite conductivity type as said substrate, said substrate and said first semiconductor region combine to form a first PN junction;
   (d) a second semiconductor region selectively formed in said first major surface of said epitaxial layer and doped with said second material, said second semiconductor region having the opposite conductivity type as said epitaxial layer, said epitaxial layer and said second semiconductor region combine to form a second PN junction;
   (e) a first main electrode formed on said first semiconductor region;
   (f) a second main electrode formed on said second semiconductor region;
   (g) wherein said first PN junction operates in a junction avalanche mode and said second PN junction operates in a rectifying mode; and
   (h) wherein said first PN junction and said second PN junction cooperate in series to form a monolithic transient suppressor coupled between said first and second main electrodes for limiting said transient voltages.

2. The semiconductor device of claim 1 wherein said first material is N-type material and said second material is a P-type material.

3. The semiconductor device of claim 1 wherein said first material is a P-type material and said second material is a N-type material.

4. The semiconductor device of claim 1 wherein said substrate and said first semiconductor region combine to form a transient voltage suppressor diode having a capacitance greater than 10,000 picofarads.

5. The semiconductor device of claim 4 wherein said first epitaxial layer and said second semiconductor region combine to form a rectifier diode having a capacitance less than 100 picofarads.

6. The semiconductor device of claim 5 wherein said series combination of said transient voltage suppressor diode and said rectifier diode has a total capacitance between said first and second main electrodes that is lower than said capacitance of said rectifier diode.

7. The semiconductor device of claim 4 wherein said transient voltage suppressor diode has a breakdown voltage less than 30 volts DC.

8. The semiconductor device of claim 1 wherein said first and second electrodes are formed by depositing by an evaporation process compounds of titanium, nickel, and gold.

9. The semiconductor device of claim 1 wherein said semiconductor device is packaged in a dual-in-line (DIP) package, said package having leads for surface mounting to a printed circuit board.

10. A low capacitance, semiconductor device for limiting transient voltages and comprising:
    (a) a first semiconductor region having a first PN junction and first and second major surfaces;
    (b) a second semiconductor region selectively formed on said first major surface of said first semiconductor region, said second semiconductor region having a second PN junction and a first main surface;
    (c) a first main electrode formed on said second main surface of said first semiconductor region;
    (d) a second main electrode formed on said first main surface of said second semiconductor region;
    (e) wherein said first PN junction operates in a junction avalanche mode and said second PN junction operates in a rectifying mode; and
    (f) wherein said first PN junction and said second PN junction cooperate in series to form a monolithic transient voltage suppressor coupled between said first and second main electrodes for limiting said transient voltages.

11. The semiconductor device of claim 10 wherein said first semiconductor region is an avalanche junction transient voltage suppressor diode having a high capacitance.

12. The semiconductor device of claim 11 wherein said second semiconductor region is a rectifying diode having a capacitance that is approximately three magnitudes lower than said first semiconductor region.

13. The semiconductor device of claim 12 wherein said first semiconductor region and said second semiconductor region combined in series having a total capacitance that is approximately equal to said second semiconductor region.

* * * * *